(12) United States Patent
Thomas et al.

(10) Patent No.: US 6,589,355 B1
(45) Date of Patent: Jul. 8, 2003

(54) CLEANING PROCESSES USING HYDROFLUOROCARBON AND/OR HYDROCHLOROFLUOROCARBON COMPOUNDS

(75) Inventors: Raymond Hilton Percival Thomas, Niagara County, NY (US); Rajiv Ratna Singh, Erie County, NY (US); Kane David Cook, Erie County, NY (US); Gary Michael Knopeck, Erie County, NY (US); Robert Scott Wedinger, Morris County, NJ (US)

(73) Assignee: AlliedSignal Inc., Morristown, NJ (US)

( * ) Notice: Subject to any disclaimer, the term of this patent is extended or adjusted under 35 U.S.C. 154(b) by 39 days.

(21) Appl. No.: 09/670,127

(22) Filed: Sep. 26, 2000

Related U.S. Application Data

(60) Provisional application No. 60/162,554, filed on Oct. 29, 1999.

(51) Int. Cl.$^7$ .................................................. C23G 1/00
(52) U.S. Cl. ........................... 134/3; 134/25.4; 134/26; 134/28; 134/30; 134/34; 134/35; 134/36; 134/42; 134/902; 134/11; 134/19; 134/31
(58) Field of Search ............................... 134/3, 19, 25.4, 134/26, 28, 30, 34, 35, 36, 42, 902, 11, 31

(56) References Cited

U.S. PATENT DOCUMENTS

| | | | |
|---|---|---|---|
| 4,512,285 A | | 4/1985 | McGehee ..................... 119/44 |
| 5,073,206 A | * | 12/1991 | Wilson et al. ................. 134/40 |
| 5,124,503 A | * | 6/1992 | Li et al. ......................... 134/31 |
| 5,219,490 A | * | 6/1993 | Basu et al. ..................... 134/12 |
| 5,512,285 A | | 4/1996 | Wilde ....................... 424/195.1 |
| 5,514,220 A | | 5/1996 | Wetmore et al. .......... 134/22.18 |
| 5,514,221 A | * | 5/1996 | Bolmer ......................... 134/40 |
| 5,674,825 A | * | 10/1997 | Buchwald et al. ............. 252/67 |
| 5,688,833 A | * | 11/1997 | Lund et al. ............. 252/182.24 |
| 6,113,708 A | * | 9/2000 | Hopple et al. ................ 134/1.3 |
| 6,162,304 A | * | 12/2000 | Weidman et al. ............. 134/10 |
| 6,355,113 B1 | * | 3/2002 | Nalewajek et al. ........... 134/10 |
| 6,395,699 B1 | * | 5/2002 | Kitamura et al. ........... 510/176 |

FOREIGN PATENT DOCUMENTS

| | | |
|---|---|---|
| DE | 199 03 243 A | 8/2000 |
| EP | 0 391 035 A | 10/1990 |
| EP | 0 587 169 A | 3/1994 |
| WO | WO 84 02291 A | 6/1984 |
| WO | WO 95 18834 A | 7/1995 |
| WO | WO 99 61177 A | 12/1999 |

OTHER PUBLICATIONS

DesMarteau et al. "New Chemical Alternatives for the Protection of Stratospheric Ozone", EPA Project Summary, Feb. 1996, pp. 1–4.*
Defibaugh et al. "Compressed and Saturated Liquid Densities for 18 Halogenated Organic Compounds", J. Chem. Eng. Data, 1997, 42, 160–168.*
Database WPI, Section Ch, Week 199849, Derwent Publications Ltd., London, GB: Class E19, AN 1998–578197. XP 002160486 & JP 10 260537 A (SHARP KK), Sep. 29, 1998 abstract.
Patent Abstracts of Japan, vol. 013, No. 243 (E–768), Jun. 7, 1989 & JP 01 045131 A (Hitachi Ltd), Feb. 17, 1989 abstract.
Carole LeBlanc,"The Evolution of Cleaning Solvents," Precision Cleaning@Witter Publishing.com, www.precisioncleaningweb.com/article_index.cm.cfm?article=66 (last visited Oct. 26, 2000).
Barbara Kanegsberg, "Precision cleaning without ozone depleting chemicals," Chemistry & Industry (Oct. 21, 1996).
Michael Roth, "Thermodynamic Prospects of Alternative Refrigerants as Solvents for Supercritical Fluid Extraction", Analytical Chemistry, vol. 68, No. 24 (Dec. 15, 1996), pp. 4474–4480; Gary A. Cantrell, John A. Blackwell, "Comparison of 1,1,1,2-tetrafluoroethane and carbon dioxide–based mobile phases for packed column supercritical fluid chromatography", Journal of Chromatography A. 782 (1997) 237–246, pp. 4474–4480 (Elsevier Science B.V.);.
Dr. Sidney C.. Chao, "Dry Wash Cleaning Process", Global Technolgoes, LLC (visited Sep. 18, 2000) http://www.globaltechno.com/drywash.html.

* cited by examiner

Primary Examiner—Sharidan Carrillo
(74) Attorney, Agent, or Firm—Deborah M. Chess; Colleen D. Szuch

(57) ABSTRACT

Disclosed are methods of cleaning articles of manufacture using hydrofluorocarbon and hydrochlorofluorocarbon fluids. The methods comprise generally the steps of (a) providing a hydrofluorocarbon and/or hydrochlorofluorocarbon fluid in liquid or supercritical state; (b) contacting an article of manufacture with said fluid; and (c) removing substantially all of said fluid from said article of manufacture.

12 Claims, 1 Drawing Sheet

Figure 1:
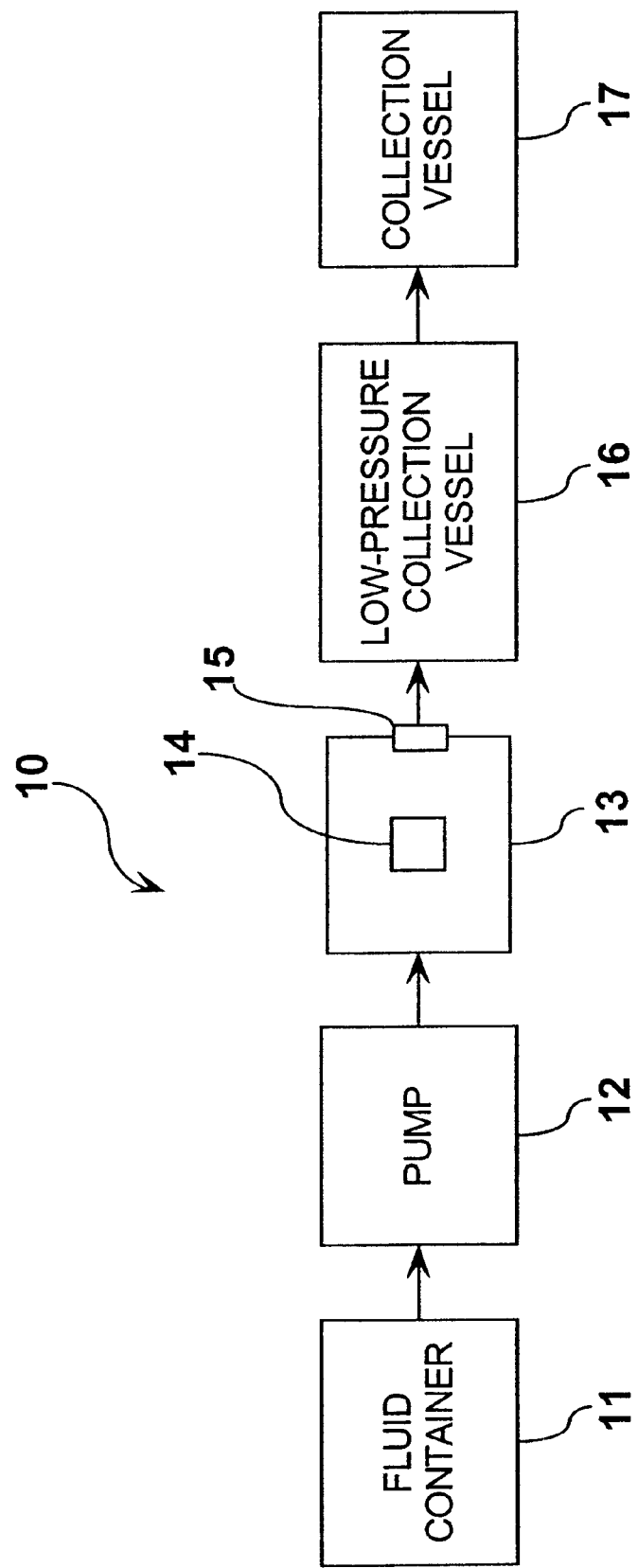

“Without Ozone Depleting Chemicals”, Chemistry & Industry, October, 1996, p. 788.]

Recognizing these and other drawbacks of the prior art, the present inventors have perceived a need for a new, efficient and more desirable method for cleaning articles of manufacture, such as printed circuit boards. These and other objects are achieved by the present invention as described below.

CLEANING PROCESSES USING HYDROFLUOROCARBON AND/OR HYDROCHLOROFLUOROCARBON COMPOUNDS

CROSS-REFERENCE TO RELATED APPLICATION

This application claims the benefit of U.S. Provisional Application Serial No. 60/162,554, which was filed with the United States Patent and Trademark Office on Oct. 29, 1999 and which is incorporated herein by reference.

FIELD OF INVENTION

The present invention relates generally to the use of hydrofluorocarbon and hydrochlorofluorcarbon compounds in cleaning processes. More specifically, the present invention relates to a method of cleaning a wide variety of articles of manufacture, especially printed circuit boards, using hydrofluorocarbons and/or hydrochlorofluorocarbons in certain subcritical states and in supercritical states.

BACKGROUND

In the manufacture of printed circuit boards, surface-mount assemblies and other, similar, electronic assemblies, solder flux is commonly applied to the solderable surfaces of the assembly prior to soldering. Solder flux is usually a blend of rosin (abietic acid) and activators. The activators are typically ionic compounds such as amine hydrochlorides. The purpose of the flux is to remove metal oxides from the surface of metal leads in order to render them more solderable. During the soldering operation the flux is heated to very high temperatures (essentially the temperature of molten tin/lead solder) and is "baked" onto the assembly. This solder flux residue is potentially harmful to the assembly and must be removed. The ionic materials, when exposed to moisture, are particularly harmful as they become mobile and conductive.

In the recent past, chlorofluorocarbon (CFC) solvents were used to clean solder flux from articles of manufacture such as printed circuit boards. These solvents were very effective and economical. However, since the recognition that CFC's are harmful to the environment, many manufacturers have switched to aqueous cleaners. Such cleaners clean adequately but are disadvantageous because they require energy intensive processes and costly disposal after use.

Carbon dioxide, both in the liquid state and in the supercritical state, has been proposed as an alternative to aqueous cleaning. However, the use of carbon dioxide is disadvantageous for several reasons. One such disadvantage is that the use of carbon dioxide requires very high pressures, which necessitate the use of relatively expensive pressure equipment. Another disadvantage is that carbon dioxide is not effective in cleaning some polar substrates.

Hydrofluorocarbons (HFC's) are an environmentally safer alternative to CFC's but it has been reported in the art that they are ineffective cleaners. Leblanc, for example, notes that "though they [HFC's] contain no chlorine, their high vapor pressure and low solubility make them poor cleaners." ["The Evolution of Cleaning Solvents, Precision Cleaning, May, 1997, p. 14.] This is supported by Kanegsberg who comments that HFC's, "while useful as carrier for other solvents and as rinsing agents, with a Kauri Butanol (KB) number of about 10, on their own have little or no solvency for most soils of interest". ["Precision Cleaning

DESCRIPTION OF THE INVENTION AND PREFERRED EMBODIMENTS

The present invention is directed to a method of cleaning a wide variety of articles of manufacture, but especially printed circuit boards, using hydrofluorocarbon ("HFC") compounds or hydrochlorofluorocarbon ("HCFC") compounds, or mixtures of HFC and HCFC compounds. The present inventors have found unexpectedly that certain HFC's and HCFC's alone or in combination with small amounts of polar solvents dramatically outperform carbon dioxide in liquid and supercritical based cleaning processes. Since the HFC's and HCFC's have both lower vapor pressures and critical pressures than carbon dioxide, the required operating pressures for equipment needed for the present methods will be lower, and the equipment with which they are used will be less expensive. This is important since one of the barriers to the use of supercritical technology is the high cost of very high pressure equipment.

According to certain embodiments of the present invention, the methods of cleaning an article of manufacture containing contaminants on a surface thereof comprise the steps of (a) providing a hydrohalocarbon compound as a supercritical fluid; (b) contacting at least the contaminated surface of the article of manufacture with said supercritical hydrohalocarbon-containing fluid; and (c) removing substantially all of said supercritical hydrohalocarbon-containing fluid from said article of manufacture. As used herein, the term hydrohalocarbon refers to any compound that is an HFC or an HCFC.

It is believed that the methods of the present invention can be used to clean a wide variety of articles of manufacture including, for example, printed circuit boards, including circuit boards with surface mounted devices, and silicon wafers. For silicon wafers, the present invention can be used to effectively clean and remove cured and uncured photoresists, which are deposited on said wafers when patterns for the manufacture of computer chips are laid down thereon. Moreover, it is believed that the methods of the present invention are especially applicable to the cleaning of printed circuit boards.

As used herein, the term "supercritical fluid" refers generally to a fluid, comprising at least one HFC or HCFC compound, in its supercritical state and also refers to HFC or HCFC compounds which are in the liquid state and have a boiling point below about 16° C. at atmospheric pressure. The present inventors believe that such liquid fluids act in certain respects like fluids in their supercritical state for many embodiments of the present invention. Any fluid in a supercritical state comprising a single HFC or HCFC fluid or mixture of HFC and/or HCFC fluids, as well as any mixture of HFC or HCFC fluid(s) with other materials and/or additives will be a "supercritical fluid" for purposes of the present invention. Any liquid-state fluid, having a boiling point below about 16° C. at atmospheric pressure, comprising a single HFC or HCFC fluid or mixture of HFC and/or HCFC fluids, as well as any mixture of HFC or HCFC fluid(s) with other materials and/or additives will be a "supercritical fluid" for purposes of the present invention.

Any of a wide range of HFC's or HCFC's can be used in the method of the present invention to provide supercritical fluids. Suitable HFC's include, for example, difluoromethane ("R-32"), pentafluoroethane ("R-125"), isomers of tetrafluoroethane ("R-134 and R-134*a*"), trifluoromethane ("R-23"), trifluoroethane isomers ("R-143" and "R-143*a*"), pentafluoroethane ("R-125") and isomers of pentafluoropropane (for example, "R-245*fa*", "R-245*ea*", "R-245*ca*", and "R-245*eb*") and the like. Suitable HCFC's include chlorodifluoromethane ("R-22"), tetrafluorochloroethane ("R-124") and the like. In certain preferred embodiments, the HFC used in the present invention is R-23 or R-32. In other preferred embodiments, the HCFC used in the present invention is R-22 or R-124.

The HFC and HCFC compounds of the present invention can be used alone or in admixture with one another. When mixtures are used, azeotropes or azeotrope-like or constant boiling mixtures containing the compounds are particularly preferred. For example, such mixtures include the azeotrope of R-32 and R-125 as described in U.S. Pat. No. 4,978,467, incorporated herein by reference.

Other materials can be added to the hydrohalocarbon-containing fluids to improve their cleaning ability. These materials include: straight chain, branched and cyclic alcohols having from about one to about eight carbons, such as methanol, ethanol, propanol and butanol; straight chain, branched and cyclic chlorinated alkanes such as chloroform, methylene chloride, chlorinated ethanes, propanes and butanes; oxygenate compounds such as aldehydes, ketones, esters and ethers, such as dimethyl ether; compounds that have heteroatoms such as nitrogen, sulfur and phosphorous; and aromatic and non-aromatic cyclic compounds. Generally, these materials are present in an amount of from about 0.1 wt % to about 25 wt % and preferably in an amount of from about 0.1 wt % to about 10 wt %.

In certain preferred embodiments, from about 0.1 wt % to about 10 wt % of methanol is added to a hydrohalocarbon-containing fluid, especially one consisting essentially of an HFC. Applicants have found that the addition of methanol in such amounts tends to increase the cleaning efficiency of supercritical fluids provided from hydrohalocarbon compounds. For example, the use of about 0.5 wt % of methanol with a supercritical fluid consisting essentially of R-125 was found to be six times more efficient at cleaning according to the present invention than R-125 neat.

Additives known to be useful in solvent cleaning applications may also be used in the process of the invention. Suitable additives include: stabilizers such as nitroalkanes having from about one to about five carbons; acid neutralizers such as alkyl and aromatic epoxides; and surfactants such as ionic or non-ionic surfactants, including fluorinated and non-fluorinated surfactants. These additives are generally present in an amount of from about 0.1 wt % to about 5 wt % and preferably from about 0.1 to about 1 wt %.

According to certain embodiments of the present invention, the providing step (a) comprises subjecting a fluid comprising an HFC and/or HCFC to conditions sufficient to form a supercritical fluid. Generally, the HFC's, HCFC's, other materials and additives described herein are all commercially available. HFC or HCFC fluids suitable for use as supercritical fluids in the present invention are formulated, according to certain embodiments, by mixing the desired ingredients under sufficient pressure to put the HFC or HCFC in a liquid state. For embodiments in which the normal boiling point of the compound is above about 16° C., the liquid state hydrohalocarbon(s) is (are) subjected to conditions sufficient to put the fluid in a supercritical state. For fluids in the supercritical state, the temperature and/or pressure may be raised above the critical temperature and critical pressure, respectively, of the fluid. For example, FIG. 1 is a block diagram of an apparatus 10 for use with the present invention in which a fluid may be subjected to conditions sufficient to form a supercritical fluid. In FIG. 1, a HFC/HCFC fluid container 11 is connected to a pump 12. Pump 12 is connected to chamber 13 in which is contained an article 14 to be cleaned. According to the present method, an HFC/HCFC fluid, not shown, held in container 11 is passed through pump 12 wherein the pressure and/or temperature of the fluid are raised to a point sufficient to form a supercritical fluid. The supercritical fluid is then passed into chamber 13 for cleaning the article contained therein. This method and any other known methods for providing a supercritical hydrohalocarbon-containing fluid and then exposing a contaminated article of manufacture to said supercritical fluid may be used according to the present invention.

Those of skill in the art will be readily able to determine the temperature and pressure to which HFC and HCFC compound must be subjected to form supercritical fluids according to the present invention. The temperature will depend, in part, on both the HFC's and/or HCFC's used and upon the pressure. In general, supercritical fluids are provided according to the present invention by maintaining the HFC or HCFC at a temperature of from about −10° C. to about 200° C., and even more preferably from about 15° C. to about 130° C. In certain preferred embodiments, the pressure at which the supercritical fluid is provided is generally from about 25 psia to about 10,000 psia, and more preferably from about 100 to 3,500 psia.

In light of the above disclosure those of skill in the art will be readily able to provide a supercritical fluid according to the present invention without undue experimentation.

According to preferred embodiments of the present invention, the contacting step (b) comprises covering at least a portion of a contaminated surface of an article of manufacture with a supercritical fluid and dissolving at least a portion of the contaminants from the surface in the supercritical fluid such that removal of the fluid results in the removal of contaminants from the contacted portion of the article of manufacture.

Any known method for covering at least a portion of a contaminated surface of an article of manufacture can be used in the present invention including, for example, immersion of the article in the supercritical fluid, spraying the article or the like. In preferred embodiments of the present invention, the coating method is immersion.

Any known method for immersing an article of manufacture in a supercritical fluid can be used in the present invention including, especially, immersing an article of manufacture in a stream of supercritical fluid. For example, the cleaning apparatus illustrated via block diagram in FIG. 1 can be used to immerse an article of manufacture in a stream of supercritical fluid according to preferred embodiments of the present invention. In FIG. 1, a supercritical fluid, formed by passing an HFC or HCFC fluid through pump 12, is allowed to stream into chamber 13 and out through an expansion valve 15 into a low-pressure collection vessel 16. When introduced into chamber 13, the supercritical fluid expands to fill the chamber. Consequently, the article 14 held within chamber 13 is immersed within the supercritical fluid stream as it flows from pump 12 to vessel 16 via valve 15.

Alternatively, the article of manufacture may be immersed via "pressure pulsing" as described in U.S. Pat. No. 5,514,220, issued to Wetmore et al., incorporated herein by reference. Generally, pressure pulsing involves contacting an article with a fluid under supercritical or near supercritical conditions and periodically pulsing or spiking the pressure of the supercritical fluid to higher levels and then lowering the pressure back to the original level. Those of skill in the art will be readily able to adapt such a procedure to the present invention without undue experimentation.

In embodiments of the present invention wherein the supercritical fluid is a fluid in its liquid state, an article of manufacture may be immersed by dipping at least a portion of the article of manufacture in the liquid-state fluid. Those of skill in the art will be readily able to adapt such a procedure to the present invention without undue experimentation.

Those of skill in the art will recognize that the conditions, including flow rate, temperature, pressure and time period, under which an article is immersed in a stream of supercritical fluid according to preferred embodiments of the present invention will vary depending on a number of factors including the HFC or HCFC fluids used. For example, in certain preferred embodiments wherein the HCFC fluid comprised R-22, 100% of solder flux impurities on a printed circuit board were removed at a temperature of about 25° C. and a pressure of about 151 psia. Additionally, in certain preferred embodiments wherein the HFC fluid comprised R-32, 90% of solder flux impurities on a printed circuit board were removed at a temperature of about 100° C. and a pressure of about 1200 psia. In light of the above disclosure, one of ordinary skill in the art will be readily able to optimize immersion conditions for use in the present invention without undue experimentation.

The removing step (c) preferably comprises evaporating the supercritical fluid. According to preferred embodiments, the evaporating step comprises changing the pressure and/or temperature of the supercritical fluid such that the fluid is converted to the gaseous state. As those of skill in the art will recognize, fluids in their supercritical state can be readily converted to the gaseous state by changing the pressure, the temperature or both pressure and temperature such that the fluid is no longer under supercritical conditions. Furthermore, fluids of the present invention in their liquid state (fluids whose atmospheric boiling point is about 16° C. or lower) can generally be converted to gasses by lowering the pressure or increasing the temperature.

The change in conditions surrounding the supercritical fluids can cause contaminants dissolved in the supercritical fluid to precipitate out of solution. Accordingly, in certain preferred embodiments, after an article has been contacted by a supercritical fluid to remove contaminants therefrom, the supercritical fluid is passed into a collection chamber wherein the pressure and/or temperature is changed to drop the contaminants out of the fluid. For example, in FIG. 1, an article 14, held within chamber 13 is immersed in a stream of supercritical fluid. The supercritical fluid removes contaminants from article 14 and flows through valve 15 into collection vessel 16. When the fluid passes through valve 15, the pressure of the fluid is dropped, and the supercritical fluid is converted to a gas in collection vessel 16. The contaminants dissolved within the fluid are precipitated and collected within vessel 16. In light of the above disclosure, those of skill in the art will be readily able to evaporate and remove supercritical fluid according to the present invention.

After a supercritical fluid has been evaporated and contaminants have been removed therefrom according to the present invention, the fluid may be condensed and recycled for use in the cleaning process. For example, FIG. 1 shows a collection vessel 17 into which gaseous HFC or HCFC fluid is pumped and condensed to liquid HFC or HCFC fluid. The liquid HFC or HCFC fluid can be recycled back to container 11 for reuse.

EXAMPLE

In order that the invention may be more readily understood, reference is made to the following example which is intended to be illustrative of the invention, but it is not intended to be limiting in scope.

This example illustrates the efficacy of various HFC and HCFC fluids in cleaning applications.

Four HFC/HCFC fluids were prepared in accordance with the present invention and tested for their efficacy in cleaning circuit boards. The four fluids, comprising R-22, R-32, R-134a, and R-125 with 0.5 wt % methanol, respectively, were tested under various temperature and pressure conditions. The results of such tests are summarized in Table 1. Each of the fluids of the invention met or exceeded the cleaning efficacy of carbon dioxide, used as a standard cleaning fluid in industry. For comparison, the cleaning efficacy of carbon dioxide, R-125 (neat) and R-143a were tested and the results of these tests are shown in Table 1.

The HFC/HCFC and carbon dioxide fluids were all tested via the following experimental method:

Experimental method. Two 2 inch×2.5 inch coupons were cut from a circuit board. Each coupon was cleaned and then coated on both sides with fully activated solder flux [Kenco 1585 RA flux]. The average coating per coupon was 20 milligrams per square inch. Two coupons were then hung on a rack. The rack was put into a high pressure vessel that had been washed with water and isopropanol to remove any ionic contaminants. The high pressure vessel was sealed and evacuated. The cleaning fluid being evaluated was then loaded into the vessel using a vacuum rack and wet ice or very small amounts of liquid nitrogen. Once the fluid was loaded, the entire vessel was put into a bath that had been equilibrated at the temperature of the experiment. Alternatively, the high pressure vessel was wrapped with a heating blanket that was controlled by a thermostat set at the desired temperature and the exposure to heating was maintained for a time sufficient to achieve the required temperature. The timing of the exposure was then started. After the required time of exposure, the fluid was allowed to escape from the vessel and condensed in a collector vessel for disposal. The coupons were then removed from the vessel and their cleanliness measured with an Alpha Metals Omegameter 600 conductivity meter. The amount of flux left on the board was measured by washing the board with isopropanol and measuring the conductivity of the isopropanol wash using the conductivity meter. The cleanliness data reported in Table 1 report the percentage reduction in the amount of flux left on the board.

TABLE 1

Cleaning efficacy of various fluids

| NUMBER | FLUID | PRESSURE [PSIA] | TEMPERATURE, ° C. | TIME (MINUTES) | CLEAN |
|---|---|---|---|---|---|
| C1 | $CO_2$ | 1300 | 40 | 45 | <10 |
| C2 | R-125 (neat) | 875 | 95 | 45 | <10 |

TABLE 1-continued

Cleaning efficacy of various fluids

| NUM-BER | FLUID | PRESSURE [PSIA] | TEMPERA-TURE, °C. | TIME (MINUTES) | CLEAN |
|---|---|---|---|---|---|
| C3 | R-143a | 825 | 95 | 45 | <10 |
| E1 | R-22 | 775 | 100 | 45 | 100 |
| E2 | R-22 | 151 | 25 | 45 | 100 |
| E3 | R-22 | 151 | 25 | 5 | 78 |
| E4 | R-32 | 1200 | 100 | 45 | 90 |
| E5 | R-32 | 875 | 80 | 45 | 80 |
| E6 | R-32 | 707 | 70 | 45 | 65 |
| E7 | R-32 | 245 | 25 | 45 | 10 |
| E8 | R-134a | 700 | 110 | 45 | 60 |
| E9 | R-125/ 0.5 wt % MeOH | 875 | 95 | 45 | 60 |

As shown in Table 1, several HFC's and HCFC's dramatically outperformed carbon dioxide in removing ionic solder flux resides from test coupons when such HFC and HCFC fluids were applied at supercritical temperatures and pressures. We further found that these same fluids removed ionics, though to a lesser degree, when applied at temperatures and pressures slightly below critical. As was noted previously, HFC's, as a class, have heretofore been considered to be poor cleaning compounds. Although it is known that, in general, solvency tends to increase in the critical region, the degree of contaminant removal exhibited by the HFC's was surprising, especially with respect to ionics removal since this phenomenon is not exhibited by supercritical $CO_2$.

Having thus described certain particular embodiments of the invention, various alterations, modifications and improvements will readily occur to those skilled in the art. All such alterations, modifications and improvements are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method for cleaning an article of manufacture containing contaminants on a surface thereof comprising the steps of:

(a) providing a compound comprising 1,1,1,3,3-pentafluoropropane as a supercritical fluid in supercritical state;

(b) contacting a surface of an article of manufacture containing contaminants with said supercritical fluid in supercritical state; and (c) removing substantially all of said supercritical fluid from said surface of the article of manufacture to remove at least a portion of said contaminants.

2. The method of claim 1 wherein said supercritical fluid further comprises an oxygenate compound selected from the group consisting of aldehydes, ketones, esters, ethers and alcohols.

3. The method of claim 1 wherein said supercritical fluid further comprises from about 0.1 wt % to about 0.9 wt % of methanol.

4. The method of claim 1 wherein said contacting step (b) comprises covering at least a contaminated portion of said article with said supercritical fluid in supercritical state.

5. The method of claim 1 wherein said contacting step (b) comprises immersing at least a contaminated portion of said article in a stream of said supercritical fluid in supercritical state.

6. The method of claim 1 wherein said removing step (c) comprises converting said supercritical fluid in supercritical state to a gaseous state.

7. The method of claim 1 wherein said article of manufacture comprises a printed circuit board.

8. The method of claim 1 wherein said article of manufacture comprises a silicon wafer.

9. The method of claim 2 wherein said oxygenate compound is an alcohol selected from the group consisting of methanol, ethanol, n-propanol, isopropanol, n-butanol, isobutanol and tert-butanol.

10. The method of claim 4 wherein said contacting step (b) further comprises dissolving in said supercritical fluid at least a portion of said contaminants on said contaminated portion of said article.

11. The method of claim 6 wherein said step of converting said supercritical fluid to a gaseous state comprises changing the pressure of the supercritical fluid in supercritical state.

12. The method of claim 11 wherein said step of converting said supercritical fluid to a gaseous state further comprises changing the temperature of the supercritical fluid in supercritical state.

* * * * *